(12) United States Patent
Inoue et al.

(10) Patent No.: US 7,821,371 B2
(45) Date of Patent: Oct. 26, 2010

(54) FLAT MAGNETIC ELEMENT AND POWER IC PACKAGE USING THE SAME

(75) Inventors: Tetsuo Inoue, Yokohama (JP); Akira Sato, Yokohama (JP); Katsutoshi Nakagawa, Yokohama (JP)

(73) Assignees: Kabushiki Kaisha Toshiba, Tokyo (JP); Toshiba Materials Co., Ltd., Yokohama-Shi (JP)

( * ) Notice: Subject to any disclaimer, the term of this patent is extended or adjusted under 35 U.S.C. 154(b) by 90 days.

(21) Appl. No.: 12/092,092

(22) PCT Filed: Oct. 26, 2006

(86) PCT No.: PCT/JP2006/321368

§ 371 (c)(1),
(2), (4) Date: Apr. 30, 2008

(87) PCT Pub. No.: WO2007/052528

PCT Pub. Date: May 10, 2007

(65) Prior Publication Data

US 2009/0243780 A1    Oct. 1, 2009

(30) Foreign Application Priority Data

Nov. 1, 2005    (JP) .............................. 2005-318647

(51) Int. Cl.
*H01F 5/00* (2006.01)
*H01F 27/28* (2006.01)
*H01F 27/24* (2006.01)
*H01F 27/02* (2006.01)
*H01F 1/00* (2006.01)
*B32B 19/00* (2006.01)
*C04B 35/00* (2006.01)
*C09D 5/23* (2006.01)

(52) U.S. Cl. ...................... 336/200; 336/222; 336/223; 336/232; 336/233; 336/83; 428/928; 428/357; 148/304; 252/62.51 R; 252/62.55

(58) Field of Classification Search ...................... None
See application file for complete search history.

(56) References Cited

U.S. PATENT DOCUMENTS 6,091,310 A * 7/2000 Utsumi et al. ................. 333/12

(Continued)

FOREIGN PATENT DOCUMENTS

CN          1321991 A       11/2001

(Continued)

*Primary Examiner*—Elvin G Enad
*Assistant Examiner*—Mangtin Lian
(74) *Attorney, Agent, or Firm*—Oblon, Spivak, McClelland, Maier & Neustadt, L.L.P.

(57) ABSTRACT

A planar magnetic device 1 including a first magnetic layer 3, a second magnetic layer 5, and a planar coil 4 disposed between the first magnetic layer 3 and the second magnetic layer 5, wherein magnetic particles 7 having a shape ratio S/L of 0.7 to 1 when a length of a long axis is L and a length of a short axis orthogonal to the long axis is L are filled in a gap W between coil wirings of the planar coil 4. According to the planar magnetic device 1, it is possible to realize a planar magnetic device such as an inductor reduced in height by using fine particles that enable to effectively obtain a large inductance value.

11 Claims, 4 Drawing Sheets

U.S. PATENT DOCUMENTS

| | | | |
|---|---|---|---|
| 6,414,564 B1 * | 7/2002 | Mizoguchi et al. | 333/35 |
| 6,888,435 B2 * | 5/2005 | Inoue et al. | 336/83 |
| 7,064,643 B2 * | 6/2006 | Matsutani et al. | 336/192 |
| 7,422,697 B2 * | 9/2008 | Takahashi et al. | 252/62.55 |
| 2005/0030725 A1 * | 2/2005 | Galvagni et al. | 361/782 |
| 2005/0072955 A1 | 4/2005 | Takahashi et al. | |
| 2005/0190036 A1 * | 9/2005 | Uriu et al. | 336/200 |
| 2006/0152321 A1 * | 7/2006 | Jung et al. | 336/200 |
| 2006/0170524 A1 * | 8/2006 | Fujiwara et al. | 336/83 |
| 2008/0008897 A1 * | 1/2008 | Imagawa et al. | 428/546 |
| 2008/0248245 A1 * | 10/2008 | Maeda et al. | 428/144 |

FOREIGN PATENT DOCUMENTS

| | | |
|---|---|---|
| JP | 5 275247 | 10/1993 |
| JP | 2002 299120 | 10/2002 |
| JP | 2002 299122 | 10/2002 |
| JP | 2002 353030 | 12/2002 |
| JP | 2003 17322 | 1/2003 |

* cited by examiner

FLAT MAGNETIC ELEMENT AND POWER IC PACKAGE USING THE SAME

TECHNICAL FIELD

The present invention relates to a planar magnetic device (magnetic passive device) used as a thin inductor and, particularly, to a planar magnetic device improved in inductance by increasing magnetic permeability to a magnetic field generated in a planar coil as well as to a power source IC package using the same.

BACKGROUND ART

In recent years, various electronic appliances have actively been downsized, and there is a tendency of manufacturing various devices by using a thin film process along with such downsizing. Under the circumstances, as a magnetic device such as an inductor (reactor), a trance, and a magnetic head, there has been proposed a planar magnetic device (flat inductor) having a shell type structure wherein a planar coil having a spiral shape or a zigzag pattern (meander type) coated with a magnetic substance in place of a conventional structure having a bulk magnetic material provided with a coil, and attempts have been made for downsizing and thinning the device (see Non-Patent Document 1, for example).

In turn, as can be seen in an example of DC-DC converter for small electronic appliances, there is an increasing technological demand for enabling operation at a high operation frequency of a megahertz level or more in order to realize downsizing and lightweight of the appliances. Among others, a high frequency inductor serves as a key component, and the following characteristics are in demand.

(1) Small and thin (lightweight).
(2) Good frequency characteristics.
(3) Appropriate power capacity.

As a small inductor device, in general, those obtained by winding a coil around a bulk ferrite and those obtained by integrally baking a coating type ferrite material and a coating type conductor material have been put into practical use (see Patent Document 1, for example).

The former one is increased in proportion of a surface deteriorated layer caused by process distortion due to polishing to a total volume along with downsizing and thinning of a bulk ferrite core, so that the characteristic such as a magnetic permeability are deteriorated to hamper realization of an inductor device achieving a low loss and high inductance.

The latter one is manufactured by applying a coil by patterning so as to form a spiral shape or a toroidal shape, applying the ferrite in such a manner that a soft magnetic body is excited by the coil, and baking the coil and the ferrite. For example, a toroidal type inductor is manufactured by a process of applying a ferrite and a conductor by alternate patterning.

Patent Document 1: JP-A-2002-2999120

Non-Patent Document 1: IEEE Trans. Magn. MAG-20, No. 5, pp. 1804-1806

However, among the above-described conventional inductors, the former one is increased in proportion of surface deteriorated layer caused by process distortion due to polishing to a total volume along with downsizing and thinning of a bulk ferrite core, so that the characteristic such as a magnetic permeability are deteriorated to hamper realization of high inductance device having a reduced height. Also, since magnetic permeability of the latter one is generally low, the latter one has a drawback of having difficulty in achieving a large inductance value, and there has been a limit for the height reduction of a magnetic device such as the inductor when a large amount of magnetic material is used for compensating for the drawback.

DISCLOSURE OF THE INVENTION

In view of the conventional circumstances that it has been difficult to obtain a high inductance device that is reduced in height as described above, an object of the present invention is to realize a planar magnetic device such as a reduced height inductor by using fine particles that enables to effectively achieve a large inductance value in a planar coil.

In order to achieve the object, the inventors have conducted an extensive research on a shape and arrangement of magnetic particles that enable to effectively obtain a large inductance value in combination with a planar coil and confirmed influences that these factors exert on magnetic device characteristics by experiments. As a result, the inventors have found that magnetic permeability to a magnetic field generated on the coil is effectively improved only when a thin film inductor is formed by filling a magnetic paste containing magnetic particles having a length ratio (shape ratio) between a long axis and a short axis within a predetermined range between planar coils, and that a reduced height inductor with improved inductance value is realized.

That is, according to the present invention, a planar magnetic device includes a first magnetic layer, a second magnetic layer, and a planar coil disposed between the first magnetic layer and the second magnetic layer, wherein magnetic particles having a shape ratio S/L of 0.7 to 1 when a length of a long axis and a maximum length of a short axis orthogonal to the long axis are represented by L and S are filled in a gap between coil wirings of the planar coil.

In the planar magnetic device, the shape ratio S/L of the magnetic particles filled in the gap between coil wirings is measured as follows. That is, three observation points each having the size of 300 μm×300 μm are arbitrarily formed in a region between cut coils cut at a section that is parallel to the upper and lower magnetic layers (magnetic sheets) of the planar magnetic device (inductor) and including the planar coil, and a length of a maximum diagonal line is measured as the long axis length while measuring a length of the short axis that is cut away by the magnetic particles is measured as the short axis length, the short axis being orthogonal to the long axis and intersecting with a center point of the long axis. An average value of the short axis lengths, an average value of the long axis lengths, and an average value of the shape ratios measured in the observation regions are represented by S, L, and S/L.

In the case where the shape ratio (S/L) is less than 0.7 which is excessively small, a longitudinal direction of particles of the magnetic particles filled between the coils tend to be oriented toward a direction parallel to a coil wiring direction, resulting in an increase in demagnetizing field in a direction of a magnetic field generated when the coil is energized and a reduction in effective magnetic permeability, thereby causing an inductance value to be easily reduced. Therefore, the shape ratio S/L of the magnetic particles is set to a range of 0.7 to 1 that indicates an isotropic shape. It is possible to increase the inductance of the planar magnetic device within the shape ratio range.

The above-described range (0.7 to 1) of shape ratio S/L is based on the average values, and it is preferable that an absolute value the shape ratio of the magnetic particles filled between the coils is within a range of 0.7 to 1.

A magnetic material forming the magnetic particles and the magnetic layers is not particularly limited insofar as the magnetic material has high saturated magnetization, low retention property, high magnetic permeability, and low loss at high frequency, and preferred examples thereof include a crystalline soft magnetic alloy such as sendust, permalloy, and silicon steel, a high magnetic permeability metal such as a Fe—Co alloy, a Fe—Ni alloy, a Fe—Al alloy, a Fe—Al—Si alloy, a Co-based amorphous alloy, and a Fe-based amorphous alloy, and the like.

The planar coil having a structure that adjacent conductor coils are in parallel to each other as in the meander type coil having a spiral or zigzag form exhibits an inductance enhancing effect similar to that of the meander type coil. A thickness (height) of the planar coil is adjusted to about 10 to 200 μm.

Also, in the planar magnetic device, when the gap between the coil wirings of the planar coil is W μm, an average particle diameter D of the magnetic particles may preferably be (W/2) μm or less.

The average particle diameter D of the magnetic particles is an average value of the average value S of the short axis lengths and the average value L of the long axis lengths used when measuring the shape ratio. When the average particle diameter D is less than 0.5 μm, the magnetic particles become excessively fine and are difficult to handle. Specifically, a surface oxidized layer and a surface deteriorated layer are generated to be liable to magnetic characteristics deterioration by thermal oscillation. Also, drawbacks such as difficulty in uniformly mixing the particles when preparing a paste and the like are detected with such particle diameter.

When the average particle diameter D is larger than (W/2), the magnetic particles are not sufficiently filled between the coils to reduce the inductance. The average particle diameter D may more preferably be (W/3) μm or less.

Further, a filling ratio of the magnetic particles in the gap between the coil wirings of the planar coil in the planar magnetic device may preferably be 30 vol. % or more. When the filling ratio of the magnetic particles in the gap between the coil wirings is less than 30 vol. %, the inductance of the planar magnetic device is undesirably reduced. Therefore, the filling ratio of the magnetic particles may preferably be 30 vol. % or more, more preferably 50 vol. % or more.

In the planar magnetic device, the magnetic particles may preferably be made from at least one of magnetic materials including an amorphous alloy, a fine crystalline alloy having an average crystal particle diameter of 20 μm or less, and ferrite. By filling the magnetic particles made from the above-specified magnetic material in the gap between the coils, the magnetic permeability is increased to increase the inductance value of the planar magnetic device.

In the planar magnetic device, the first magnetic layer (lower magnetic layer) and the second magnetic layer (upper magnetic layer) may preferably be made from a mixture of a magnetic powder and a resin. A magnetic material forming the magnetic layers is not particularly limited insofar as the magnetic material has high saturated magnetization, low retention property, high magnetic permeability, and low loss at high frequency, and preferred examples thereof may include a crystalline soft magnetic alloy such as sendust, permalloy, and silicon steel, a high magnetic permeability metal such as a Fe—Co alloy, a Fe—Ni alloy, a Fe—Al alloy, a Fe—Al—Si alloy, a Co-based amorphous alloy, and a Fe-based amorphous alloy, and the like. The thickness of each of the magnetic layers may preferably be set to about 50 to 400 μm.

In the planar magnetic device, a total thickness of the planar magnetic device may preferably be 0.5 mm or less.

Since an object of the present invention is to realize a smaller circuit component by housing the planar magnetic device and an IC chip in one package, the advantage of one-package is impaired when the height is equal to or more than the semiconductor chip. Therefore, the thickness of the planar magnetic device should be 0.625 mm or less which is an ordinary height of semiconductor device pellets, desirably 0.3 mm or less. When the thickness of the planar magnetic device is about 0.4 mm or less, it is possible to realize the one-packaging of a layered type as shown in FIGS. 7 and 8 described later in this specification.

In the planar magnetic device, the planar coil may preferably be made from a mixture of a metal powder and a resin. As the metal powder, an electro-conductive powder such as Cu, Ag, Au, Pt, Ni, Sn and the like may be used, and Cu and Ag are specifically preferred from the view point of electro-conductivity and economy. The planar coil is formed by applying a mixture of the metal power, the resin, and a solvent in a predetermined pattern and solidification as a coil by naturally drying, heating to a solvent vaporization temperature or higher, or heating operation including a reaction such as reduction.

A width, a height (thickness), and an interval (gap) of the planar coil wirings are factors that influence on the characteristics of the coil, and it is desirable to set the width and the thickness to values as large as possible while increasing a wiring density and to set the interval of the wirings to a value as small as possible within a range enabling to maintain the insulation property. Specifically, the height (thickness) of the coil wiring may preferably be 20 μm or more, preferably 40 μm or more. When the coil wiring is thin, coil resistance is increased to hamper achievement of high quality factor (Q value). It is preferable to increase the thickness as large as possible in accordance with the desired performance. Also, as described in the foregoing, the narrower interval between the coil wirings is the better. When the wiring interval is wide, the device size is increased and the coil length is increased to increase coil direct current resistance, thereby reducing the quality factor (Q value). Therefore, a preferred wiring interval is 200 μm or less.

In the planar magnetic device, the magnetic particles may preferably be a magnetic mixture containing a resin binder in an amount of 20 mass % or less. When the amount of the resin binder contained in the magnetic particles forming the magnetic layer is more than 20 mass %, magnetic characteristics of the magnetic layer are deteriorated to reduce the inductance. Therefore, the binder content should be regulated to 20 mass % or less, and it is preferable that the resin binder is substantially perfectly volatilized when the magnetic layer is ultimately formed, and that substantially only the magnetic particles are aggregated and solidified to form the magnetic layer.

In the planar magnetic device, the magnetic layer is dried in a state where the resin binder permeates into the magnetic layer after the magnetic layer is formed by filling the magnetic powder in the gap between the coil wirings, and a content of the resin binder in the dried magnetic layers may preferably be 0 to 20 mass %. Since the binder is a non-magnetic substance, it is desirable to volatilize the binder component by heating after the formation of magnetic layer for reducing the amount of the binder remaining in the magnetic layer to a value small as possible from the view point of realizing the high inductance.

The planar magnetic device described above is produced, for example, by the following process steps. A paste is prepared by mixing the magnetic power having the predetermined shape ratio (S/L) and the average particle diameter D with the vehicle, and the first magnetic layer is prepared by printing a magnetic sheet of a predetermined size on a substrate by using the paste.

After forming the magnetic pattern (first magnetic layer), an insulation layer made of: a cellulose derivative such as nitrocellulose, ethylcellulose, and carboxymethyl cellulose; an organic material such as an acryl resin, a ketone resin, an ammonium resin, a melamine resin, polyvinyl butyral, a petroleum resin, polyester, an alkyd resin, an acryl resin, polyamide, polyurethane, a maleic acid resin, polyvinylacetate, polyvinylalcohol, polyethylene, a silicon polymer (methylsiloxane, methylphenylsiloxane)polystyrene, a butadiene/styrene copolymer, vinyl pyrrolidone, polyether, an epoxy resin, an aryl resin, a phenolformaldehyde resin, polyimide, a rosin resin, a polycarbonate resin, dammar, and copaibalsam; an inorganic substance such as $SiO_2$; and the like may be formed. Organic substances having insulating property may be used without limitation to the above-specified ones.

On the magnetic pattern or the insulation layer, the planar coil is printed by using the electroconductive metal paste such as the Ag paste or the Cu paste in the pattern of a spiral or meander. The planar coil exhibits an effect similar to that of a meander coil insofar as the adjacent conductor coil wirings are parallel to each other. The planar coil production method is not particularly limited to the metal paste printing method, and a plating method, a metal conductor foil punching method, a metal conductor etching method, a sputtering method, a vapor-phase epitaxial method including a vapor deposition method, or the like may be employed insofar as the method realizes the planar coil having low volumetric resistivity.

After forming the planar coil, the magnetic sheet is printed as the second magnetic layer in the predetermined pattern and thickness in such a manner as to cover the planar coil, so that a shortened inductor serving as a planar magnetic device wherein the planar coil is covered with the first and second magnetic layers are formed. In this case, an opening is provided at a part corresponding to a coil terminal part in the magnetic pattern of the second magnetic layer.

As the method for forming the magnetic layer on each of an upper surface and a lower surface of the planar coil, a method of adhering a magnetic thin plate with an insulating adhesive, a method of coating and drying a magnetic paste obtained by dispersing a magnetic powder into a resin, a method of plating a magnetic material, and the like are known, and it is possible to employ these methods in combination.

The power source IC package according to the present invention is formed by mounting the planar magnetic device prepared as described above, a control IC and a semiconductor chip such as a field effect transistor (FET) on an identical substrate or an identical package in a planar direction or a height direction. Particularly, the feature of the power source IC package, i.e. the IC integrated type wherein the planar magnetic device and the IC chip are integrally mounted on one substrate, is effective for device downsizing. Also, it is possible to achieve the one-package by integrally mounting a plurality of semiconductor chips and an active device. For example, a power source function such as a DC-DC converter may be incorporated into the package, or a similar power source function is achieved by providing an external capacitor.

According to the planar magnetic device having the above-described structure, since the magnetic fine particles having the shape ratio S/L that is a ratio between the long axis length (L) and the length of the short axis (S) orthogonal to the long axis is 0.7 to 1 are filled in the gap between the wirings, it is possible to improve the magnetic permeability to the magnetic field generated on the planar coil, thereby realizing the magnetic device serving as an inductor improved in inductance and reduced in height.

Further, it is also possible to obtain the one-package by mounting the planar magnetic device prepared as described above, a control IC, and a semiconductor chip such as a field effect transistor (FET) on an identical substrate or an identical package in a planar direction or a height direction, thereby making it possible to achieve high density mounting of functional devices as well as to exhibit a prominent effect for achieving a small and high performance semiconductor device.

BEST MODE FOR CARRYING OUT THE INVENTION

Hereinafter, embodiments of the present invention will be described in detail with reference to the accompanying drawings and the following examples.

Example 1

Fine magnetic particles were prepared by treating a molten material of sendust having an alloy composition of 5.5 wt. % Al-10 wt. % Si—Fe by a water-gas atomizing method. Specifically, the magnetic particles were prepared by dispersing the molten material by injecting the molten material out from a furnace while simultaneously spraying an inert gas (Ar), and introducing the dispersed particles into water for rapid cooling.

The magnetic particles obtained as described above had an average diameter (50% by volume) of 28 μm, and only magnetic particles having the size less than 63 μm were selected by passing the magnetic particles through a sieve having a mesh opening of 63 μm. As a result, the magnetic particles having a shape ratio S/L and an average particle diameter D shown in Table 1 were prepared. Further, a paste was prepared by mixing 1.4 mass % of a vehicle (binder) with the magnetic particles.

Figure 1:
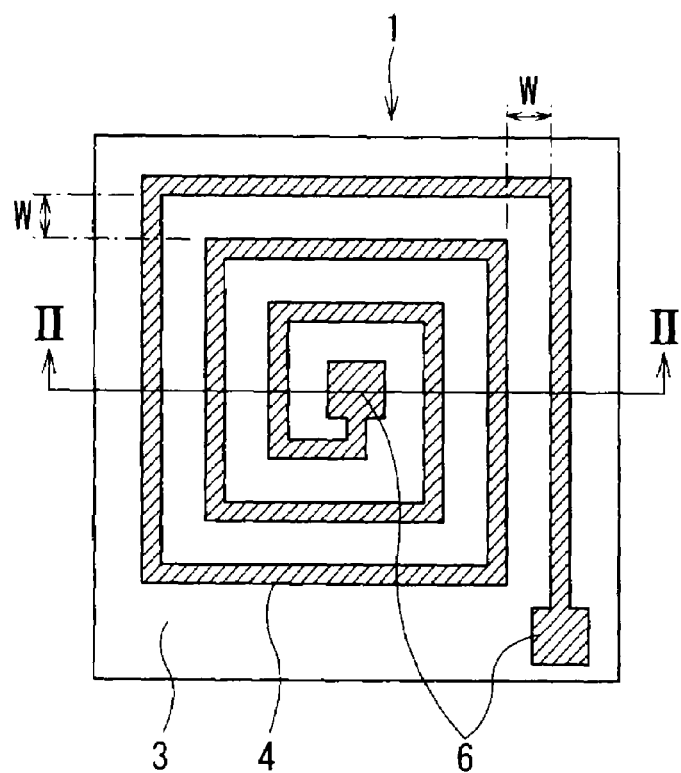
FIG. 1 is a plan view showing a planar magnetic device according to one embodiment of the present invention in the case where a spiral type is used as a coil shape.
Figure 2:
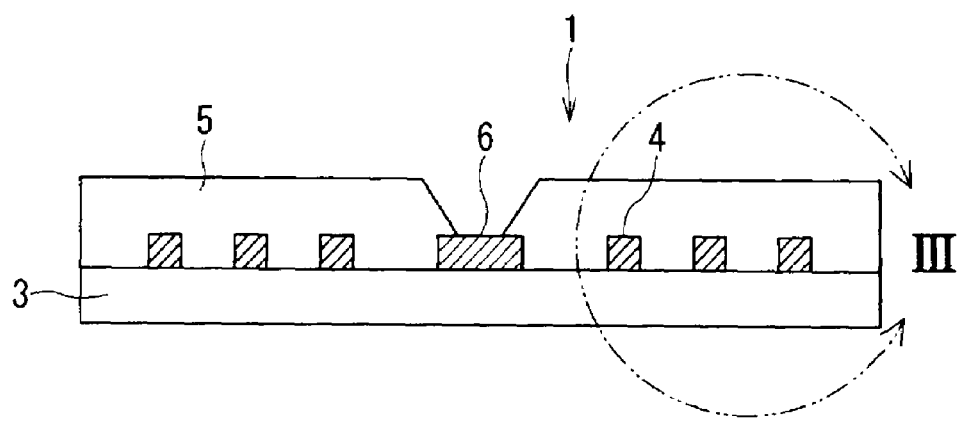
FIG. 2 is a sectional view showing a II-II section of FIG. 1 as viewed in a direction of arrows.
Figure 3:
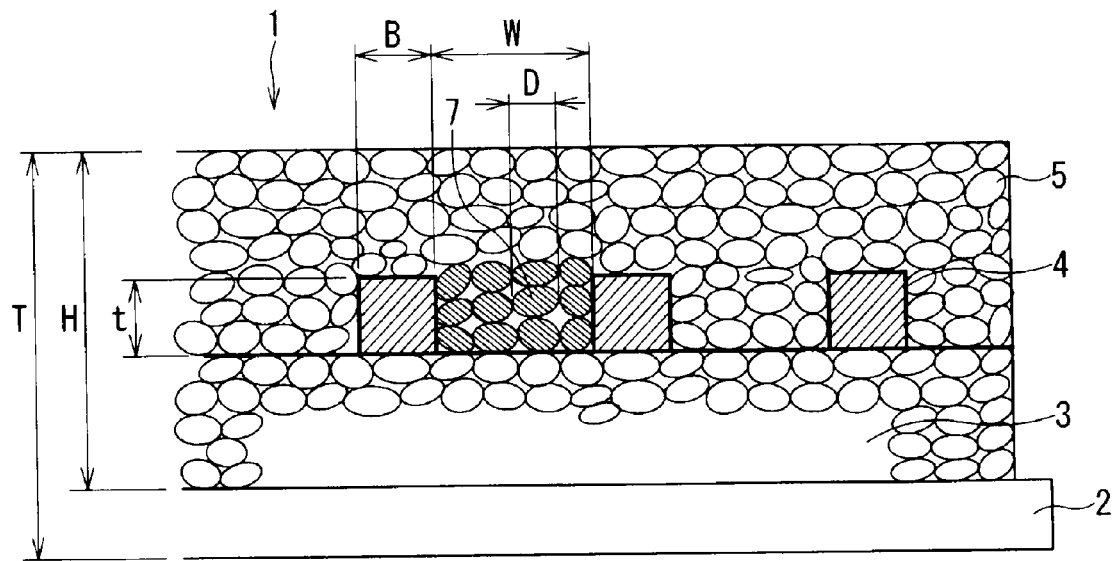
FIG. 3 is a partially enlarged sectional view showing a part III of FIG. 2.

Next, on an upper surface of a Si substrate having the thickness of 300 μm used as a substrate 2 as shown in FIGS. 1 to 3, a patterned magnetic sheet having the thickness of 100 μm and the size of 10 mm×10 mm was printed to form a first magnetic layer 3.

On an upper surface of the first magnetic layers, an Ag paste was printed in the pattern of a spiral as shown in FIG. 1 to form a planar coil 4. In Example 1, the planar coil 4 having a coil wiring width B of 300 μm, a gap W between the coil wirings of 125 μm, the number of coil winding of 8 turns, and a thickness t of 40 μm was manufactured.

Figure 4:
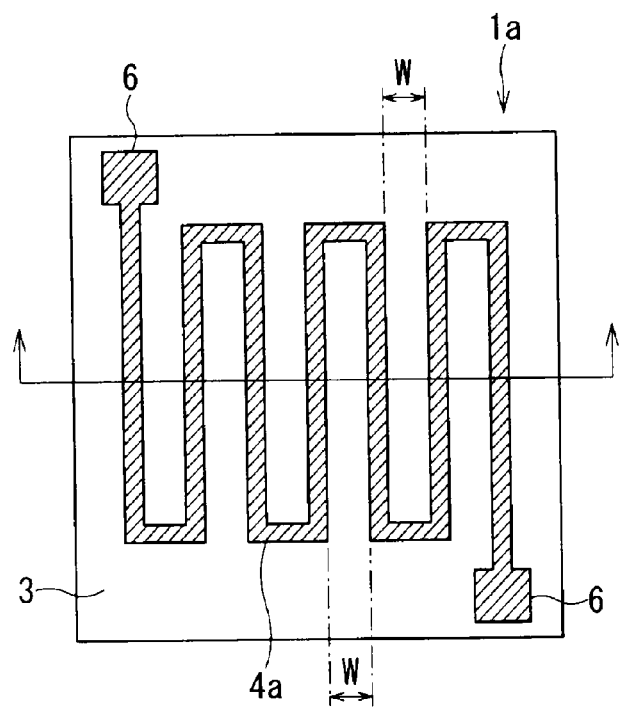
FIG. 4 is a plan view showing a planar magnetic device according to one embodiment of the present invention in the case where a meander type is used as a coil shape.

As shown in FIG. 4, the same effect is exhibited by a planar coil 4a wherein the adjacent conductor coils in the planar coil are parallel to each other as in an meander coil having a zigzag form.

After forming the planar coil 4, a magnetic sheet is formed again by patterning to achieve a magnetic layer thickness of 100 μm in the planar coil part 4 to form a second magnetic layer 5 shown in FIG. 2. In this case, an opening was provided on the second magnetic layer 5 at a part corresponding to a terminal 6 of the planar coil part 4. As a result, the planar magnetic device 1 shown in FIGS. 1 to 3 was manufactured as described above.

Figure 5:
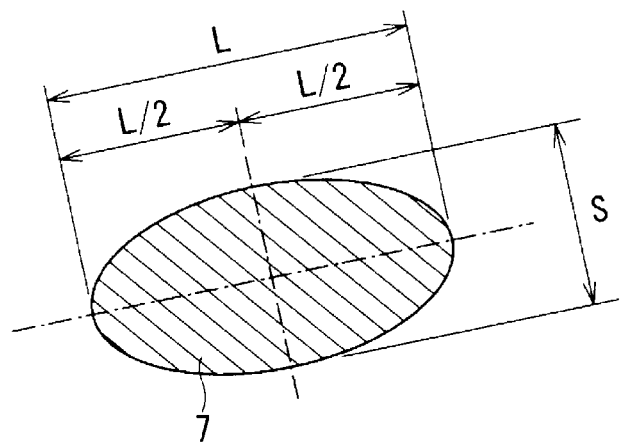
FIG. 5 is a sectional view showing a size measurement method of magnetic particles shown in FIG. 3.

Three observation points each having the size of 300 μm×300 μm are arbitrarily formed in a region between coils cut at a section that is parallel to the upper and lower magnetic layers (magnetic sheets) 3 and 5 of the planar magnetic device (inductor) 1 and includes the planar coil 4. In the section of each of the magnetic particles 7 appeared in the observation regions, a length of a maximum diagonal line is measured as the long axis length (L) while measuring a length of the short axis that is cut away by the magnetic particles 7 is measured as the short axis length (S), the short axis being orthogonal to the long axis and intersecting with a center point of the long axis as shown in FIG. 5. A shape ratio and an average diameter of the magnetic particles 7 filled between the coils were measured from the average values thereby to obtain the values shown in Table 1.

Characteristics of the thus-obtained inductor serving as the planar magnetic device are also shown in Table 1.

When flat magnetic particles are filled in the gap between the coil wirings in the spiral coil, a longitudinal direction of particles of the flat magnetic particles tends to be oriented toward a coil wiring direction. Accordingly, since a direction of a magnetic field excited by a coil electric current becomes the same as a short axis direction, anisotropic nature derived from a demagnetizing field is enhanced by the particle shape, resulting in reduction of effective magnetic permeability and a reduction of inductance. However, in the case of using the isotropic magnetic particles as in Example 1, it is possible to effectively suppress the reduction in magnetic permeability due to isotropic demagnetizing field. Therefore, it was possible to obtain the magnetic device having the large inductance value. In addition, since it is possible to form the thin magnetic layers and the thin planar coil, it is possible to reduce the height of the magnetic device (inductor) using the high magnetic permeability material.

Figure 7:
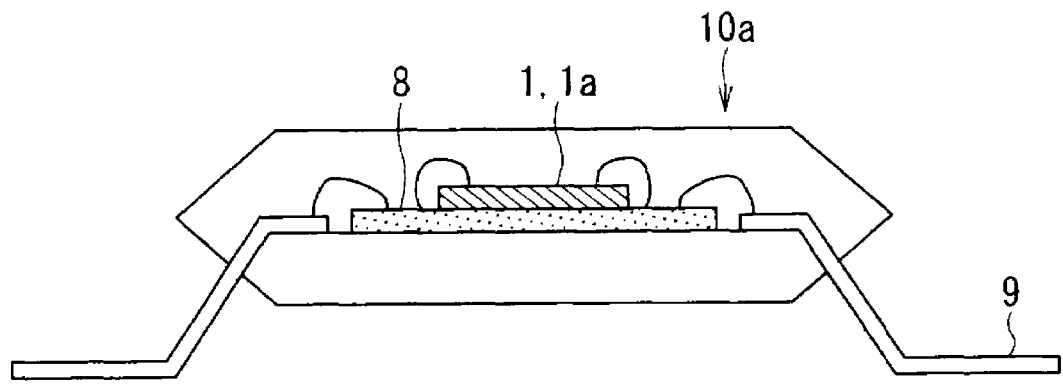
FIG. 7 is a sectional view showing one example of IC package obtained by packaging the planar magnetic device according to the present invention and a semiconductor chip by layering or laminating the planar magnetic device and the semiconductor chip.
Figure 8:
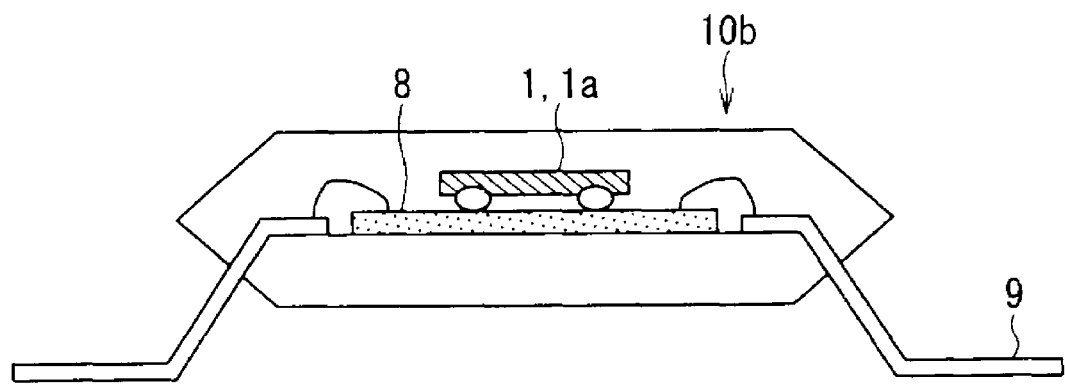
FIG. 8 is a sectional view showing one example of structure of an IC package obtained by layering or laminating the planar magnetic device according to the present invention and a semiconductor chip by a bump method.

Particularly in Example 1, as a result of polishing the Si substrate used as a base to 60 μm by chemical mechanical etching, a total thickness T of the inductor serving as the planar magnetic device 1 was reduced to 0.3 mm, which is less than the thickness of a semiconductor chip 8 such as a control IC and a field effect transistor (FET). Therefore, it is possible to realize short IC packages 10, 10a, and 10b with the built-in inductor by packaging the semiconductor chip 8 such as a switching IC and the planar magnetic device 1 in the integral fashion as shown in FIGS. 6 to 8.

Figure 6:
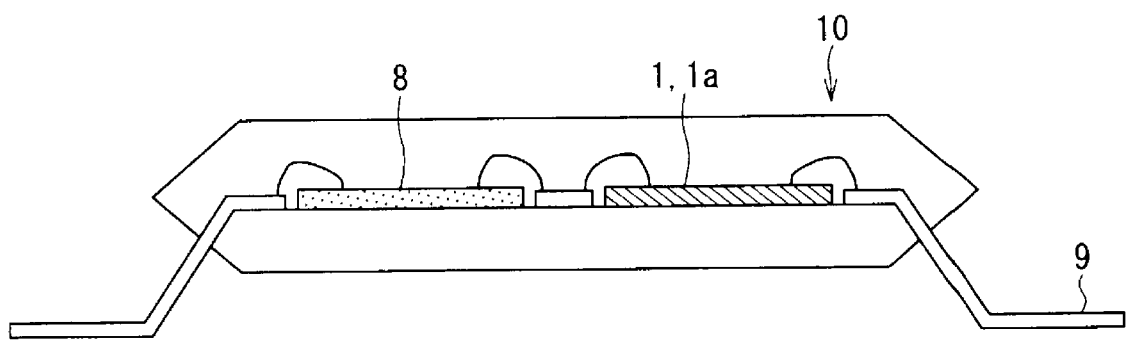
FIG. 6 is a sectional view showing one example of IC package obtained by packaging the planar magnetic device according to the present invention and a semiconductor chip on one plane.

The IC package 10 shown in FIG. 6 has a structure that the semiconductor chip 8 and the planar magnetic devices 1 and 1a are disposed on a package substrate in a planar direction, connected to the lead frame 9, and fixed by a molded resin. The IC package 10a shown in FIG. 7 has a structure that the semiconductor chip 8 and the planar magnetic devices 1 and 1a are layered or laminated on a package substrate in a thickness direction, connected to the lead frame 9, and fixed by a molded resin. The IC package 10b shown in FIG. 8 has a structure that the semiconductor chip 8 and the planar magnetic devices 1 and 1a are layered or laminated on a package substrate in a thickness direction by bump connection method, connected to the lead frame 9, and fixed by a molded resin.

According to the shortened package including the inductor serving as the planar magnetic device, it is possible to readily realize a small DC-DC converter and a power source IC package as one package.

The base (substrate) 2 for carrying the planar magnetic device is not limited to the Si substrate, and a $SiO_2$ substrate, a Si substrate on which an oxide film or a nitride film is formed, an alumina ($Al_2O_3$) substrate, an aluminum nitride (AlN) substrate, or the like may be used as the base 2.

Example 2

Amorphous magnetic particles were obtained by dispersing a molten material having an alloy composition of $(Co0.90-Fe0.05-Mn0.02-Nb0.03)71-Si15-B14$ by an atomic ratio by injecting the molten material out from a furnace in accordance with a water atomization method and a gas atomization method while simultaneously spraying an inert gas (Ar) to the molten material and introducing the dispersed particles into water for rapid cooling.

The thus-obtained magnetic particles had an average diameter (50% by volume) of 14 μm, and only magnetic particles having the size less than 32 μm were selected by passing the magnetic particles through a sieve having a mesh opening of 32 μm. After that, a paste was prepared by mixing a vehicle (binder) of 0.9 mass % with the magnetic particles, and a patterned magnetic sheet having the thickness of 100 μm and the size of 10 mm×10 mm was printed on a Si substrate to form a first magnetic layer 3.

After forming the magnetic pattern (first magnetic layer 3), an insulation layer having the thickness of 4 μm was formed by applying and imidizing polyimide. As the insulation material, it is possible to use an insulating layer formed from an organic substance such as an elastomer including a chloroprene rubber, a nitrile rubber, polysulfide, a butadiene rubber, a SBR, and a silicone rubber and a resin mainly including a thermoplastic resin such as vinyl acetate, polyvinyl alcohol, polyvinyl acetal, vinyl chloride, and polystyrene; an inorganic substance such as $SiO_2$; and the like.

A planar coil 4 shown in FIG. 1 was formed by patterning a Cu paste in a spiral form on the insulation layer. In Example 2, a base coil pattern having a coil wiring width B of 300 μm, a gap W between the coil wirings of 100 μm, the number of coil windings of 9 turns, and a thickness t of 40 μm was manufactured. A Cu plating layer having the thickness of 30 μm was formed on the base coil pattern by non-electrolytic plating method to form a Cu-planar coil 4 having a total thickness of 35 μm. The plating process may be performed by electrolytic plating method.

After forming the coil pattern, an insulation layer of: a cellulose derivative such as nitrocellulose, ethylcellulose, and carboxymethyl cellulose; an organic material such as an acryl resin, a ketone resin, an ammonium resin, a melamine resin, polyvinyl butyral, a petroleum resin, polyester, an alkyd resin, an acryl resin, polyamide, polyurethane, a maleic acid resin, polyvinylacetate, polyvinylalcohol, polyethylene, a silicon polymer (methylsiloxane, methylphenylsiloxane)polystyrene, a butadiene/styrene copolymer, vinyl pyrrolidone, polyether, an epoxy resin, an aryl resin, a phenolformaldehyde resin, polyimide, a rosin resin, a polycarbonate resin, dammar, and copaibalsam; an inorganic substance such as $SiO_2$; and the like may be formed. After forming the planar coil, a magnetic sheet is formed again by patterning to achieve the thickness of 100 μm of a magnetic layer 5 in the planar coil part to form a second magnetic layer 5 shown in FIG. 2. In this case, an opening was provided on the second magnetic layer 5 at a part corresponding to a terminal 6 of the planar coil part 4. The inductor serving as the planar magnetic device according to Example 2 was prepared as described above.

Characteristics of the thus-obtained inductor are shown in Table 1.

In the case where the isotropic magnetic particles are filled in the gap between the coil wirings in the spiral coil as in Example 2, a demagnetizing field becomes isotropic thereby to effectively suppress a reduction in magnetic permeability. Therefore, it was possible to obtain the magnetic device having the large inductance value.

Examples 3 to 11

Magnetic particles having the shape ratio and the average particle diameter shown in Table 1 were prepared by pulverizing and sieving the sendust used in Example 2, the Co-based amorphous alloy used in Example 2, and a ferrite alloy having a composition of $Ni_{0.5}Zn_{0.5}Fe_2O_4$ (molar ratio). A magnetic material paste was prepared by mixing the thus-obtained magnetic particles with a binder in a predetermined amount that is the content shown in Table 1.

Each of inductors according to Examples 3 to 11 serving as planar magnetic devices was prepared by forming a first magnetic layer 3 on a Si substrate used in Example 1 by using the above described magnetic paste, followed by forming a planar coil having an inter-coil gap of W shown in Table 1 by using an Ag paste, and forming a second magnetic layer having a predetermined thickness by using the same magnetic paste.

The magnetic particles used in Examples 3 and 5 has a crude and coarse particle diameter while the magnetic particles used in Example 4 has a ultra-fine magnetic diameter. Example 6 is one example of inductor having a magnetic layer wherein a proportion of the magnetic material was reduced. Also, the Co-based amorphous alloy magnetic particles were used in Example 7, and the ferrite alloy magnetic particles were used in Example 8. The planar coil having the thickness of 80 μm and formed of two Ag print layers was used in Example 9. The thickness of each of the first and second magnetic layers was increased to 200 μm in Example 10. In Example 11, the thickness of each of the first and second magnetic layers was increased to 200 μm, and a planar coil having the thickness of 80 μm and formed of two Ag print layers was used.

Characteristics of the thus-obtained inductors are shown in Table 1.

Example 12

Magnetic particles were prepared in the same manner as in Example 1 by subjecting the molten sendust to dispersion and cooling treatment in accordance with the water atomizing method. The thus-obtained magnetic particles had an average diameter (50% by volume) of 28 μm, and only magnetic particles having the size less than 63 μm were selected by passing the magnetic particles through a sieve having a mesh opening of 63 μm. A magnetic paste was prepared by adding an organic binder to the magnetic particles in a content of 1.4 mass %. Next, a first magnetic layer 3 was formed on a Si substrate used in Example 1 by printing a patterned magnetic sheet having the thickness of 100 μm and the size of 10 mm×10 mm, followed by drying at 100° C. for 30 minutes, and baking at 150° C. for 60 minutes.

As the organic binder, it is possible to use a cellulose derivative such as nitrocellulose, ethylcellulose, and carboxymethyl cellulose and an organic material such as an acryl resin, a ketone resin, an ammonium resin, a melamine resin, polyvinyl butyral, a petroleum resin, polyester, an alkyd resin, an acryl resin, polyamide, polyurethane, a maleic acid resin, polyvinylacetate, polyvinylalcohol, polyethylene, a silicon polymer (methylsiloxane, methylphenylsiloxane)polystyrene, a butadiene/styrene copolymer, vinyl pyrrolidone, polyether, an epoxy resin, an aryl resin, a phenolformaldehyde resin, polyimide, a rosin resin, a polycarbonate resin, dammar, and copaibalsam. Organic substances having insulating property may be used without limitation to the above-specified ones.

Next, on an upper surface of the first magnetic layer 3, an Ag paste was printed in the pattern of a spiral as shown in FIG. 1 to form a planar coil 4. In Example 12, the planar coil 4 having a coil wiring width B of 300 μm, a gap W between the coil wirings of 125 μm, the number of coil winding of 8 turns, and a thickness t of 40 μm was manufactured.

Next, a second magnetic layer 5 was formed by forming a magnetic sheet pattern by printing the same magnetic material paste in such a manner that the magnetic material paste covers the planar coil 4, and that the thickness of the magnetic layer in the planar coil part 4 becomes 100 μm. In this case, an opening was provided on the magnetic pattern at a part corresponding to a terminal 6 of the coil 4. Thus, a planar magnetic device having a thickness H of an inductor of 240 μm and a thickness T including the Si substrate 2 of 300 μm was manufactured.

After that, the Si substrate (base material) on which the inductor was printed as described above was dipped into a solvent obtained by dissolving ethylcellulose into BCA (butylcarbitol acetate). After 10 minutes of standing, the base material was taken out and dried to prepare a planar magnetic device according to Example 12 in which fragility (brittleness) was diminished.

The solution for dipping the inductor is not limited at all insofar as the solvent is formed of a resin component such as a cellulose derivative including nitrocellulose, ethylcellulose, and carboxymethyl cellulose, an organic substance such as an acryl resin, an acetyl resin, a ketone resin, an ammonium resin, a melamine resin, polyvinyl butyral, a petroleum resin, polyester, an alkyd resin, polyamide, polyurethane, a maleic acid resin, polyvinylacetate, polyethylene, polyvinylalcohol, a silicon polymer (methylsiloxane, methylphenylsiloxane) polystyrene, a butadiene/styrene copolymer, vinyl pyrrolidone, polyether, an epoxy resin, an aryl resin, a phenol formaldehyde resin, polyimide, a rosin resin, a polycarbonate resin, dammar, and copaibalsam, and a solvent that dissolves or uniformly disperses the organic substance.

Characteristics, cracks at handling, states of peeling of the thus-obtained inductors are shown in Table 1.

Since it was possible to fill the organic binder between the magnetic particles that were sufficiently close to one another by the dipping, a junction structure wherein the rigid adhesive, not the fragile bonding between the fine particles, existed in the gap. Therefore, it was possible to impart flexibility that realizes satisfactory rigidity and handling easiness as well as to achieve the reduction in height without occurrence of cracks and peeling in the magnetic layer.

As in Example 12, it is possible to reduce the height in the inductor obtained by using the magnetic material particles having high magnetic permeability ratio. Since the total thickness of the inductor is 0.3 mm which is equal to the thickness of the semiconductor chip such as a switching IC particularly in Example 12, it is possible to realize the IC package with the built-in inductor as shown in FIGS. 6 to 8 by packaging the inductor integrally with the semiconductor chip. For example, it is possible to realize a shortened DC-DC converter IC package that is obtained as one package due to the inductor.

Example 13

An inductor serving as a planar magnetic device according to Example 13 was prepared in the same manner as in Example 1 except for using a polyimide film having the thickness of 25 μm in place of the Si substrate as a base material and magnetic particles having the shape ratio and the average diameter shown in Table 1 and finishing with the dipping treatment in the same manner as in Example 12.

Example 14

An inductor was prepared in the same manner as in Example 1 except for using magnetic particles having the shape ratio and the average diameter shown in Table 1 and a polyimide film having the thickness of 25 μm in place of the Si substrate as a base material. After that, a solution obtained by dissolving ethylcellulose into BCA (butylcarbitol acetate) was sprayed on the inductor formed as described above in a state where an external terminal part was covered with a mask or the like, followed by drying, thereby preparing a planar magnetic device according to Example 14 having reduced fragility.

The solution to be sprayed on the inductor is not particularly limited insofar as the solvent is formed of a resin component such as a cellulose derivative including nitrocellulose, ethylcellulose, and carboxymethyl cellulose, an organic substance such as an acryl resin, a ketone resin, an ammonium resin, a melamine resin, polyvinyl butyral, a petroleum resin, polyester, an alkyd resin, polyamide, polyurethane, a maleic acid resin, polyvinylacetate, polyethylene, polyvinylalcohol, a silicon polymer (methylsiloxane, methylphenylsiloxane) polystyrene, a butadiene/styrene copolymer, vinyl pyrrolidone, polyether, an epoxy resin, an aryl resin, a phenolformaldehyde resin, polyimide, a rosin resin, a polycarbonate resin, dammar, and copaibalsam, and a solvent that dissolves or uniformly disperses the organic substance. Also, it is possible to fill the organic binder between the magnetic particles by a method of immersing the organic binder from the magnetic surface by printing without limitation to the spraying.

Characteristics, cracks at handling, states of peeling of the thus-obtained inductor serving as the planar magnetic device are shown in Table 1.

Example 15

Amorphous magnetic particles having the shape ratio and the average particle diameter shown in Table 1 were obtained by dispersing a molten material having an alloy composition of (Co0.90-Fe0.05-Mn0.02-Nb0.03)71-Si15-B14 by an atomic ratio by injecting the molten material out from a furnace while simultaneously spraying an inert gas (Ar) to the molten material and introducing the dispersed particles into water for rapid cooling.

The thus-obtained magnetic particles had an average diameter (50% by volume) of 14 μm, and only magnetic particles having the size less than 32 μm were selected by passing the magnetic particles through a sieve having a mesh opening of 32 μm. After that, a paste was prepared by mixing a cellulose-based organic binder in a content of 0.9 mass % with the magnetic particles. A patterned magnetic sheet having the thickness of 100 μm and the size of 10 mm×10 mm was printed by using the paste on a Si substrate having the thickness of 60 μm thereby to form a first magnetic layer 3.

Next, a planar magnetic device according to Example 15 was prepared in the same manner as in Example 2 except for adhering a Cu foil planar coil having the same size and shape as the punched coil of Example 2 formed by punching a copper foil having the thickness of 30 μm to the first magnetic layer 3 in place of the coil formed in Example 2.

Comparative Example 1

Magnetic particles having a ratio Sc/Lc between a length (Lc) of a long axis and a length (Sc) of a short axis orthogonal to the long axis was 0.4 were prepared by pulverizing the sendust used in Example 1. Only fine magnetic particles having the size less than 63 μm were selected by passing the magnetic particles through a sieve having a mesh opening of 63 μm. A planar magnetic device according to Comparative Example 1 was prepared in the same manner as in Example 1 except for performing the above process steps.

Comparative Example 2

Only fine magnetic particles having the size less than 32 μm were selected by passing the amorphous magnetic particles having a composition of (Co0.90-Fe0.05-Mn0.02-Nb0.03)71-Si15-B14 by an atomic ratio through a sieve having a mesh opening of 32 μm. A planar magnetic device according to Comparative Example 2 was prepared in the same manner as in Example 2 except for performing the above process steps.

Example 16

A planar magnetic device according to Example 16 was prepared in the same manner as in Example 1 except for using very fine sendust magnetic particles having the long axis length and the short axis length shown in Table 1.

Example 17

A planar magnetic device according to Example 17 was prepared in the same manner as in Example 1 except for using crude and coarse sendust magnetic particles having the long axis length and the short axis length that are increased as shown in Table 1.

Example 18

A planar magnetic device according to Example 18 was prepared in the same manner as in Example 1 except for reducing a proportion of a magnetic substance in a magnetic layer by increasing a content of an organic binder in magnetic particles as shown in Table 1.

Example 19

A planar magnetic device according to Example 19 was prepared in the same manner as in Example 13 except for using magnetic particles having the shape ratio and the average particle diameter shown in Table 1 and not finishing with the dipping treatment.

Results of measurements of the inductance characteristics, direction current resistances, quality factors (Q value), and handling properties (cracks, peeling state) of the inductors serving as the planar magnetic devices according to the respective Examples and Comparative Examples prepared as described above are shown in Table 1.

In this connection, the inductor thickness H in Table 1 means a distance from a lower end of the first magnetic layer to an upper end of the second magnetic layer in the planar magnetic device as shown in FIG. 3.

The shape ratio S/L of the magnetic particles was measured as follows. That is, three arbitrarily selected points each having a size of 300 μm×300 μm are observed in a section tissue that is parallel to surfaces of the inductor magnetic layers 3 an 5 and including the planar coil 4, and a length of a maximum diagonal line is measured as the long axis length while measuring a length of the short axis that is cut away by the magnetic particles is as the short axis length, the short axis being orthogonal to the long axis and intersecting with a center point of the long axis. An average value of the short axis lengths, an average value of the long axis length, and an average value of the shape ratios in the observation regions are represented by S, L, and S/L. In addition, an average diameter (average grain size) of the magnetic particles is defined as an arithmetic mean of the short axis lengths and the long axis lengths of the magnetic particles observed in the observation points.

The evaluation items of the planar magnetic devices were measured as follows. The inductance of each of the planar magnetic devices was measured by using an impedance analyzer and under the conditions of a magnetism excitation voltage of 0.5 V and a measurement frequency of 10 MHz. The direct current resistance was measured by using a tester. Likewise, the quality factor Q was measured by using an impedance analyzer and under the conditions of a magnetism excitation voltage of 0.5 V and a measurement frequency of 10 MHz. The handling properties were evaluated by way of a proportion of defective product due to rupture or the like in the positions of the magnetic layers after the termination of the whole inductor manufacturing process, wherein the proportion of less than 5% is evaluated as ◎, the proportion of less than 8% is evaluated as ○, the proportion of less than 7% is evaluated as Δ, and the proportion of 10% or more is evaluated as x.

TABLE 1

| | Manufacture Conditions | | | | | | | | |
|---|---|---|---|---|---|---|---|---|---|
| Sample No. | Inductor Thickness H [μm] | Short Axis Length S [μm] | Long Axis Length L [μm] | Shape Ratio S/L [-] | Magnetic Particle Average Diameter D [μm] | Inter-Coil Gap W [μm] | Binder Content [wt. %] | Magnetic Substance Proportion [vol. %] | Material |
| Example 1 | 240 | 19.8 | 28.2 | 0.70 | 23.9 | 125 | 1.4 | 60 | Sendust |
| Example 2 | 240 | 9.7 | 10.3 | 0.95 | 9.9 | 100 | 0.9 | 60 | Co-based Amorphous |
| Example 3 | 240 | 34.0 | 47.1 | 0.72 | 40.5 | 125 | 1.4 | 60 | Sendust |
| Example 4 | 240 | 1.7 | 2.4 | 0.72 | 1.9 | 125 | 1.4 | 60 | Sendust |
| Example 5 | 240 | 50.0 | 70.6 | 0.71 | 60.3 | 125 | 1.4 | 60 | Sendust |
| Example 6 | 260 | 20.1 | 27.0 | 0.74 | 23.6 | 100 | 5.26 | 39 | Sendust |
| Example 7 | 240 | 17.1 | 18.9 | 0.90 | 17.9 | 125 | 1.8 | 55 | Co-based Amorphous |
| Example 8 | 240 | 26.8 | 37.2 | 0.72 | 32.1 | 125 | 1.3 | 62 | Ferrite |
| Example 9 | 280 | 19.8 | 28.3 | 0.70 | 24.1 | 125 | 1.4 | 60 | Sendust |
| Example 10 | 440 | 19.8 | 28.2 | 0.70 | 24.0 | 125 | 1.4 | 60 | Sendust |
| Example 11 | 480 | 19.9 | 28.2 | 0.70 | 24.1 | 125 | 1.4 | 60 | Sendust |
| Example 12 | 240 | 19.6 | 28.1 | 0.70 | 23.9 | 125 | 1.4 | 60 | Sendust |
| Example 13 | 240 | 19.7 | 28.2 | 0.70 | 24.0 | 125 | 1.4 | 60 | Sendust |
| Example 14 | 240 | 20.0 | 28.5 | 0.70 | 24.2 | 125 | 1.4 | 60 | Sendust |
| Example 15 | 250 | 10.5 | 11.3 | 0.93 | 10.9 | 100 | 0.9 | 60 | Co-based Amorphous |
| Comparative Example 1 | 240 | 15.9 | 32.0 | 0.50 | 24.0 | 125 | 1.4 | 60 | Sendust |
| Comparative Example 2 | 240 | 7.2 | 12.9 | 0.56 | 10.1 | 100 | 0.9 | 60 | Co-based Amorphous |
| Example 16 | 240 | 0.38 | 0.53 | 0.72 | 0.46 | 125 | 2.2 | 49 | Sendust |
| Example 17 | 240 | 66.0 | 94.1 | 0.70 | 80.1 | 125 | 1.4 | 60 | Sendust |
| Example 18 | 270 | 20.1 | 28.0 | 0.72 | 24.1 | 100 | 8.2 | 28 | Sendust |
| Example 19 | 240 | 19.8 | 28.3 | 0.70 | 24.1 | 125 | 1.4 | 60 | Sendust |

| | Manufacture Conditions | | Evaluation Items | | | |
|---|---|---|---|---|---|---|
| Sample No. | Base Type | Thickness including Substrate T [μm] | Fragility Measure | Inductance [μH] | Direct Current Resistance [Ω] | Quality Index (Q value) [@10 MHz] | Handling Properties (Crackability) |
| Example 1 | Si Substrate | 300 | — | 0.79 | 1.25 | 20 | ○ |
| Example 2 | Si Substrate | 300 | — | 0.61 | 0.75 | 26 | ○ |

TABLE 1-continued

| | | | | | | | |
|---|---|---|---|---|---|---|---|
| Example 3 | Si Substrate | 300 | — | 0.8 | 1.25 | 21 | ○ |
| Example 4 | Si Substrate | 300 | — | 0.78 | 1.25 | 20 | ○ |
| Example 5 | Si Substrate | 300 | — | 0.63 | 1.25 | 16 | ○ |
| Example 6 | Si Substrate | 320 | — | 0.62 | 1.1 | 18 | ◉ |
| Example 7 | Si Substrate | 300 | — | 0.78 | 1.25 | 22 | ○ |
| Example 8 | Si Substrate | 300 | — | 0.79 | 1.25 | 20 | ○ |
| Example 9 | Si Substrate | 340 | — | 0.79 | 0.65 | 37 | ○ |
| Example 10 | Si Substrate | 500 | — | 0.87 | 1.25 | 22 | ○ |
| Example 11 | Si Substrate | 540 | — | 0.87 | 0.65 | 40 | ○ |
| Example 12 | Si Substrate | 300 | Finished with Dipping | 0.79 | 1.25 | 20 | ◉ |
| Example 13 | Polyimide Film | 265 | Finished with Dipping | 0.78 | 1.25 | 20 | ○ |
| Example 14 | Polyimide Film | 265 | Finished with Spraying | 0.785 | 1.25 | 20 | ○ |
| Example 15 | Si Substrate | 310 | — | 0.46 | 0.73 | 20 | ○ |
| Comparative Example 1 | Si Substrate | 300 | — | 0.52 | 1.25 | 13 | ○ |
| Comparative Example 2 | Si Substrate | 300 | — | 0.36 | 0.8 | 14 | ○ |
| Example 16 | Si Substrate | 300 | — | 0.58 | 1.25 | 15 | ○ |
| Example 17 | Si Substrate | 300 | — | 0.59 | 1.25 | 15 | Δ |
| Example 18 | Si Substrate | 330 | — | 0.305 | 1.1 | 9 | ◉ |
| Example 19 | Polyimide Film | 265 | — | 0.79 | 1.25 | 20 | X |

As is apparent from the results shown in Table 1, according to the planar magnetic devices of Examples in which the magnetic fine particles having the shape ratio S/L which is the ratio between the long axis length (L) and the length (S) of the short axis orthogonal to the long axis is 0.7 to 1 are filled in the gap between the wirings of the planar coil, it is possible to improve magnetic permeability to a magnetic field generated on the planar coil, thereby realizing the planar magnetic devices serving as the inductors improved in inductance and reduced in height.

Further, since it is possible to achieve the one-package by packaging the planar magnetic device prepared as described above and a semiconductor chip such as a control IC and a field effect transistor (FET) on one substrate or package in a planar direction or a height direction, it is possible to realize high density mounting of functional devices, thereby exhibiting prominent effect for downsizing and high functionality of a semiconductor device.

Particularly in the planar magnetic device in which the spiral coil is provided, since it is possible to maintain the fine magnetic particles having the shape ratio within the predetermined range in the state where they are close to each other without covering the magnetic particles with an insulating substance such as an organic binder, it is possible to suppress the reduction in magnetic permeability. Therefore, it is possible to achieve a particularly large inductance value.

Also, since it is possible to fill the organic binder between the magnetic fine particles that are sufficiently close to each other by performing the dipping as in Examples 12 and 13, the rigid adhesive exist in the gap in place of fragile bonding between the fine particles, thereby making it possible to impart satisfactory rigidity and flexibility that eliminate handling difficulty to the inductor. Thus, it is possible to prevent occurrence of cracks and peeling as well as to achieve a reduced height.

In addition, it was reconfirmed that the inductance is lowered irrespective of the type of magnetic particles when the shape ratio (S/L) of the magnetic particles filled between the coil wirings is out of the specified range.

INDUSTRIAL APPLICABILITY

According to the planar magnetic device of the present invention, due to the use of the magnetic fine particles having the shape ratio S/L, which is a ratio between the long axis length (L) and the length of the short axis orthogonal to the long axis, of 0.7 to 1, it is possible to improve the magnetic permeability to the magnetic field generated on the planar coil, thereby realizing the magnetic device serving as the inductor that is improved in inductance and reduced in height.

Further, since it is possible to achieve one packaging by mounting the planar magnetic device obtained as described above and a semiconductor chip such as a control IC and a field effect transistor (FET) on one substrate or package in a planar or height direction of the substrate or package, it is possible to realize the high density mounting of functional devices, thereby achieving a prominent effect for realizing downsizing and high functionality of a semiconductor device.

The invention claimed is:
1. A planar magnetic device comprising:
a first magnetic layer,
a second magnetic layer, and
a planar coil disposed between the first magnetic layer and the second magnetic layer,
wherein
magnetic particles, having a shape ratio S/L of 0.7 to 1 where a length of a long axis is L and a length of a short axis orthogonal to the long axis is S, fill a gap between coil wirings of the planar coil, the gap between the coil wirings of the planar coil being W, where W is 200 μm or less;
an average particle diameter of the magnetic particles is W/2 or less;
a thickness of the planar magnetic device is 0.5 mm or less; and
a filling ratio of the magnetic particles filled in the gap between the coil wirings of the planar coil is 30 vol. % or more.

2. The planar magnetic device according to claim 1, wherein the filling ratio of the magnetic particles filled in the gap between the coil wirings of the planar coil is 50 vol. % or more.

3. The planar magnetic device according to claim 1, wherein the magnetic particles are made from at least one of an amorphous alloy, a crystalline soft magnetic alloy, and ferrite.

4. The planar magnetic device according to claim 1, wherein the first magnetic layer and the second magnetic layer are made from a mixture of a magnetic powder and a resin.

5. The planar magnetic device according to claim 1, wherein the planar coil is made from a mixture of a metal powder and a resin.

6. The planar magnetic device according to claim 1, wherein the magnetic particles are a magnetic mixture containing 20 mass % or less of a resin binder.

7. The planar magnetic device according to claim 1, wherein a resin binder is dried after a magnetic layer is formed by filling the magnetic particles in the gap between the coil wirings and in a state where the resin binder penetrates into the magnetic particles, and a content of the resin binder in the dried magnetic layer is 0 to 20 mass %.

8. A power source IC package using the planar magnetic device according to any one of claims 1, 2-4, 5 and 6.

9. The power source IC package according to claim 8, wherein the power source IC package is an IC-integrated type.

10. The planar magnetic device according to claim 1, wherein the magnetic particles are a magnetic mixture containing 2 mass % or less of a resin binder.

11. The planar magnetic device according to claim 1, wherein a resin binder is dried after a magnetic layer is formed by filling the magnetic particles in the gap between the coil wirings and in a state where the resin binder penetrates into the magnetic particles, and a content of the resin binder in the dried magnetic layer is 0 to 2 mass %.

* * * * *